US006880142B2

(12) United States Patent
Cui et al.

(10) Patent No.: US 6,880,142 B2
(45) Date of Patent: Apr. 12, 2005

(54) METHOD OF DELAY CALCULATION FOR VARIATION IN INTERCONNECT METAL PROCESS

(75) Inventors: Qian Cui, Cupertino, CA (US); Robert W. Davis, Fort Collins, CO (US); Sandeep Bhutani, Sunnyvale, CA (US); Payman Zarkesh-Ha, Fremont, CA (US); John D. Corbeil, Jr., Fort Collins, CO (US); Prabhakaran Krishnamurthy, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 196 days.

(21) Appl. No.: 10/272,182

(22) Filed: Oct. 16, 2002

(65) Prior Publication Data

US 2004/0078765 A1 Apr. 22, 2004

(51) Int. Cl.[7] .............................. G06F 9/45; G06F 17/50
(52) U.S. Cl. .................................. 716/6; 716/4; 703/19
(58) Field of Search ................................. 716/1–2, 4–6, 716/10–11; 703/2, 13–14, 19

(56) References Cited

U.S. PATENT DOCUMENTS

| 5,475,607 | A | * | 12/1995 | Apte et al. ..................... 716/10 |
| 5,790,436 | A | * | 8/1998 | Chen et al. ..................... 716/5 |
| 5,819,205 | A | * | 10/1998 | Mani ............................ 702/79 |
| 6,018,623 | A | * | 1/2000 | Chang et al. ................... 716/6 |
| 6,219,631 | B1 | * | 4/2001 | Oh et al. ....................... 703/14 |
| 6,453,446 | B1 | * | 9/2002 | van Ginneken ................ 716/3 |
| 6,507,936 | B2 | * | 1/2003 | Yamaguchi ..................... 716/6 |
| 2003/0140325 | A1 | * | 7/2003 | Chen et al. ..................... 716/6 |
| 2004/0073879 | A1 | * | 4/2004 | Chen et al. ..................... 716/8 |

OTHER PUBLICATIONS

F.Y. Chang, "Generation of 3–Sigma Circuit Models and its Application to Statistical Worst–Case Analysis of IC Designs," 1977 11th Asilomar Conference on Circuits, Systems, and Computers, pp. 29–34.*
N. Chang et al., "Fast Generation of Statistically–based Worst–Case Modeling of On–Chip Interconnect," 1887 Int'l Conference on Computer Design: VLSI in Computers and Processors, pp. 720–725.*
O.S. Nakagawa et al., "Circuit Impact and Skew–Corner Analysis of Stochastic Process Variation in Global Interconnect," 1999 Int'l Interconnect Technology COnference, pp. 230–232.*
O.S. Nakagawa et al., "Modeling of Pattern–Dependent On–Chip Inteconnect Geometry Variation for Deep–Submicron Process and Design Technology," 1997 Technical Digest of Int'l Electronic Devices Meeting, pp. 137–140.*
Norman Chang et al.; "3–sigma Worst–Case Calculation of Delay and Crosstalk for Critical Net"; Hewlett–Packard Company, Palo Alto, CA; Tau Conference, 1997; pp. 104–109.

* cited by examiner

Primary Examiner—Leigh M. Garbowski
(74) Attorney, Agent, or Firm—Fitch, Even, Tabin & Flannery

(57) ABSTRACT

A method of calculating delay for a process variation includes finding a value for each of exactly two independent variables that results in a maximum or minimum variation of estimated cell delay plus net delay, calculating a variation of resistance from the value found for each of the exactly two independent variables, calculating a variation of capacitance from the value found for each of the exactly two independent variables, adding the calculated variation of resistance to a net resistance to generate a modified net resistance for a selected net, adding the calculated variation of capacitance to a net capacitance to generate a modified net capacitance for the selected net, and calculating the cell delay plus net delay from the modified net resistance and the modified net capacitance.

23 Claims, 3 Drawing Sheets

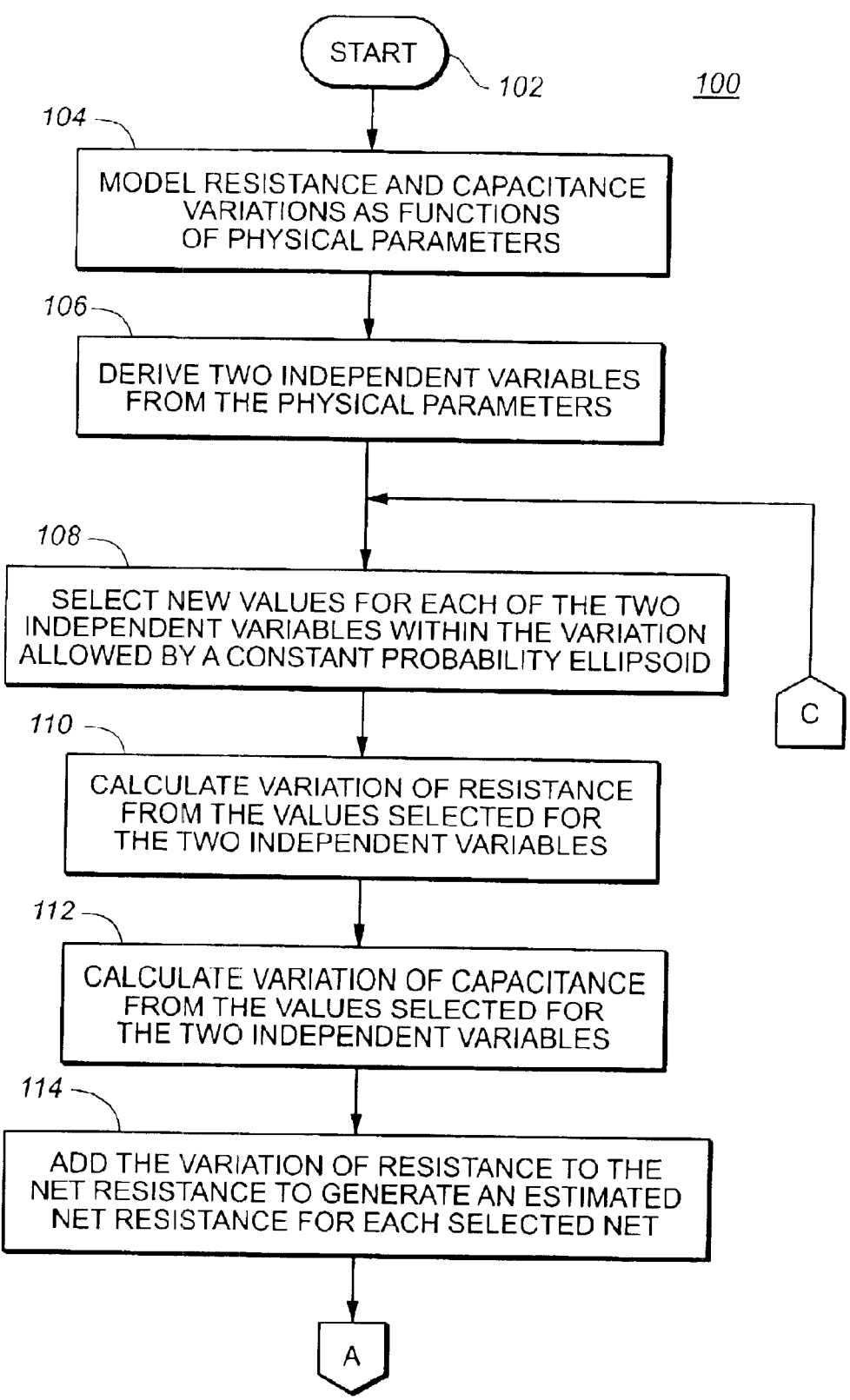
FIG._1A

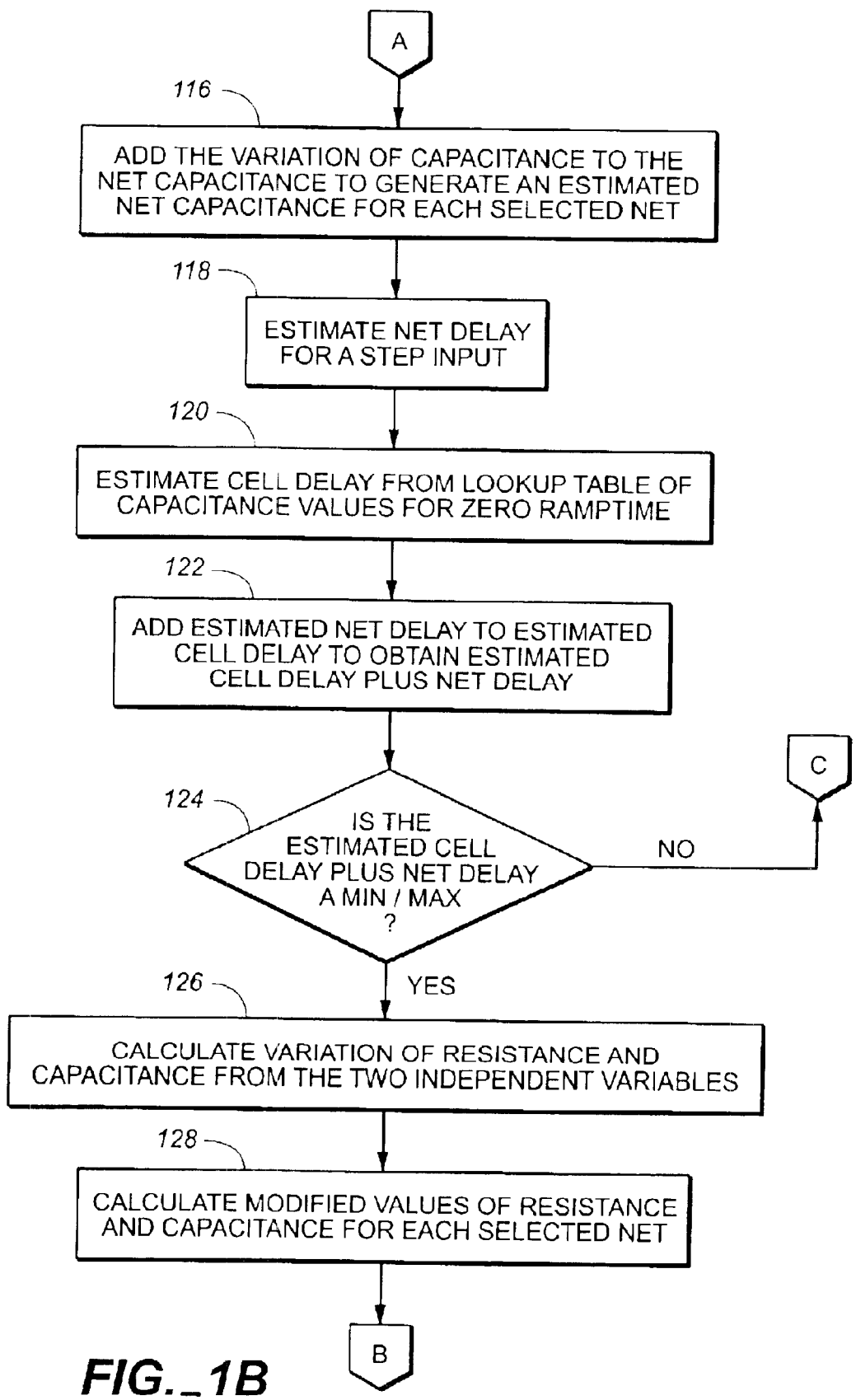
FIG._1B

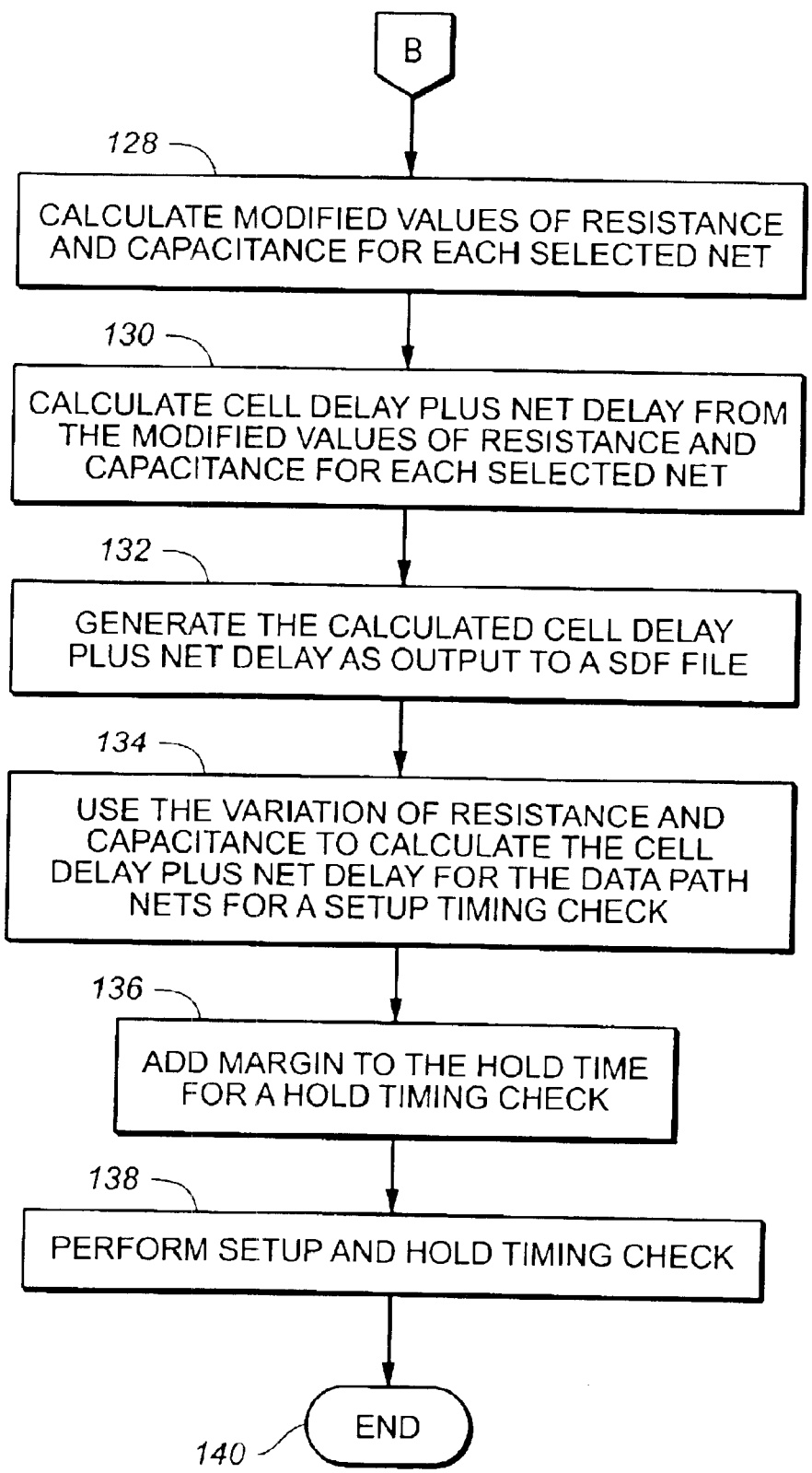
FIG._1C

METHOD OF DELAY CALCULATION FOR VARIATION IN INTERCONNECT METAL PROCESS

BACKGROUND OF THE INVENTION

The present invention is directed to methods for estimating cell delay and net delay for an integrated circuit design. More specifically, but without limitation thereto, the present invention is directed to modeling the resistance and capacitance variation as functions of physical parameters to calculate an estimated cell delay and net delay for an integrated circuit design.

Process variations in the manufacture of integrated circuits result in corresponding variations in the cell delay and net delay that must be accounted for in timing calculations for the integrated circuit design. In previous methods, the best and worst case variations are used to calculate the minimum and maximum cell and net delays. These methods are collectively referred to as corner SPEF (standard parasitic exchange format). Some of these methods include calculations for variations that lie between the extremes to cover all the variation effects. Disadvantageously, at least two extraction steps are required to calculate the delays for each variation considered. Also, for each variation, a technology file containing capacitance information for specific wire line configurations must also be generated for the extraction tool. Moreover, the physical conditions that result in worst case delay depend on the net, even to the extent that the worst case conditions for a high drive cell can be the best case conditions for a lower drive cell. Another disadvantage of corner SPEF methods arises in timing checks. A timing check determines whether the setup and hold time is met for each flip-flop in the integrated circuit design. In the worst case, the check is made with a fast clock versus slow data. However, the corner SPEF methods provide a slow clock and slow data, which is not conservative enough for a zero cycle path (the input to the first set of flip-flops) and a path without a well balanced clock tree. In other words, the corner SPEF methods do not separate the clock net and the data net.

SUMMARY OF THE INVENTION

In one aspect of the present invention, a method of calculating cell delay plus net delay for a process variation includes finding a value for each of two independent variables that results in a maximum or minimum variation of estimated cell delay plus net delay, calculating a variation of resistance from the value found for each of the two independent variables, calculating a variation of capacitance from the value found for each of the two independent variables, adding the calculated variation of resistance to a net resistance to generate a modified net resistance of each of the plurality of nets, adding the calculated variation of capacitance to a net capacitance to generate a modified net capacitance of each of the plurality of nets, and calculating the cell delay plus net delay from the modified net resistance and the modified net capacitance.

In another embodiment, a computer program product calculates cell delay plus net delay for a process variation according to well known programming techniques to perform the following functions: finding a value for each of the two independent variables that results in a maximum or minimum variation of estimated cell delay plus net delay, calculating a variation of resistance from the value found for each of the two independent variables, calculating a variation of capacitance from the value found for each of the two independent variables, adding the calculated variation of resistance to a net resistance to generate a modified net resistance of each of the plurality of nets, adding the calculated variation of capacitance to a net capacitance to generate a modified net capacitance of each of the plurality of nets, and calculating the cell delay plus net delay from the modified net resistance and the modified net capacitance.

In further embodiments, finding a value for each of the two independent variables that results in a maximum or minimum variation of estimated cell delay plus net delay includes constraining a search of the variation of capacitance to a constant probability ellipsoid.

DESCRIPTION OF THE DRAWINGS

The present invention is illustrated by way of example and not limitation in the accompanying figures, in which like references indicate similar elements throughout the several views of the drawings, and in which:

FIGS. 1A, 1B and 1C illustrate a flow chart for calculating delay for a process variation according to an embodiment of the present invention.

DESCRIPTION OF THE ILLUSTRATED EMBODIMENTS

Physical parameters including wire thickness, wire width, and intermetal dielectric thickness of the copper wire used in the new semiconductor manufacturing processes tend to have a higher variation than those of the earlier aluminum technology. The increased variation of these physical parameters have a significant impact on cell and net delays in integrated circuit designs.

Closed form models of wire capacitance are notoriously complex and are limited in accuracy and scope. The present invention avoids this complexity by modeling changes of wire capacitance instead of absolute values using second order polynomials that may be generated empirically by standard regression techniques to RSM-DOE (response surface design of experiments) and/or Monte Carlo data from simulations by a field solver such as QuickCap, available from Random Logic Corporation. The empirical analysis is performed on a sufficient sample of various test structures representative of those found in the routing of an integrated circuit. The closed form equations for the change in resistance and the change in capacitance may be obtained for a specific line structure by dividing the line structure into segments that are similar to the test structures being analyzed. The coefficients of the equations for the change in resistance and the change in capacitance for the line structure are then weighted by the capacitance contribution of the corresponding segments in the test structures.

In one aspect of the present invention, a method of calculating cell delay plus net delay for a process variation includes finding a value for each of two independent variables that results in a maximum or minimum variation of estimated cell delay plus net delay, calculating a variation of resistance from the value found for each of the two independent variables, calculating a variation of capacitance from the value found for each of the two independent variables, adding the calculated variation of resistance to a net resistance to generate a modified net resistance of each of the plurality of nets, adding the calculated variation of capacitance to a net capacitance to generate a modified net capacitance of each of the plurality of nets, and calculating the cell delay plus net delay from the modified net resistance and the modified net capacitance.

In one embodiment of the present invention, the equations for the change in resistance and the change in capacitance for a segment is effectively described by three independent variables: metal thickness (tmet), metal width (w) and intermetal dielectric thickness (timd). In addition, sufficient accuracy may be obtained using a weighted average of dense and sparse lines for all signal lines. The resulting equations have the form:

$$\Delta R = \Delta R(tmet, w) = \Delta\left(\frac{1}{tmet}\right) + \Delta\left(\frac{1}{w}\right) + p0*\Delta\left(\frac{1}{tmet}\right)*\Delta\left(\frac{1}{w}\right) \quad (1)$$

$$\Delta C = \Delta C(tmet, w, timd)$$
$$= p1*\Delta tmet + p2*\Delta w + p3*\Delta\left(\frac{1}{timd}\right) +$$
$$p4*\Delta tmet*\Delta w + p5*(\Delta w)^2$$

where $\Delta R$ is the percentage change in resistance R of a line segment, $\Delta C$ is the percentage change in capacitance C of a line segment, and p0, p1, p2, p3, p4 and p5 are coefficients. The coefficients are derived by substituting values for the physical parameters tmet, w, and tmid and the corresponding values of $\Delta R$ and $\Delta C$ for the line segment from simulation results and solving for p0, p1, p2, p3, p4 and p5. Exemplary values of the coefficients p0, p1, p2, p3, p4 and p5 for a weighted combination of isolated and dense line equations are illustrated below in Table 1.

TABLE 1

| COEFF | ISOLATED & DENSE LINES |
|---|---|
| p0 | .01 |
| p1 | 0.404 |
| p2 | 0.561 |
| p3 | 0.220 |
| p4 | .0032 |
| p5 | .0036 |

Alternatively, equations (1) may be generated by a weighted average of coefficients from a lookup table of $\Delta R$, $\Delta C$ equations for isolated and dense line segments.

The estimated cell delay plus net delay may be found from the following formula:

$$\text{Delay}=\text{Delay(cell)}+\text{Delay(wire)} \quad (2)$$

The first order step input delays are used to find the estimated cell delay and net delay. To obtain the estimated cell delay, the total capacitance is substituted for the load, and a lookup table is used to find values for the corresponding cell delay with a step input, that is, a ramptime of zero. To obtain the estimated net delay, a first order AWE (asymptotic waveform evaluation), or Elmore delay, for a step input from the driver's output pin to the receiver's input pin is used. The cell delay plus net delay is a function of R and C, that is, $$\text{Delay}=\text{Delay}(\text{Cwire},\text{Cload},\text{Rwire},\text{Rd}) \quad (3)$$

where Cwire is the wire capacitance, Cload is the load capacitance, Rwire is the wire resistance, and Rd is the driver output resistance.

R and C are functions of $\Delta R$ and $\Delta C$, that is, $$\text{Cwire}=\text{Cwire}*(1+\Delta C) \quad (4)$$

$$\text{Rwire}=\text{Rwire}*(1+\Delta R)$$

Consequently, $\Delta R$ and $\Delta C$ are a function of the physical parameters (tmet, w, timd). Similarly, the cell delay plus net delay is a function of physical parameters, that is, $$\text{Delay}=\text{Delay}(tmet,w,timd)=\text{Delay}(pc1,pc2) \quad (5)$$

where pc1 and pc2 are exactly two independent parameters that are representative of the vast majority of the data. The two independent parameters pc1 and pc2 are each derived from a linear combination of the physical parameters selected so that varying either pc1 and pc2 results in a maximum change in $\Delta C$. The equations for $\Delta R$ and $\Delta C$ as a function of pc1 and pc2 are given by:

$$\Delta R = \Delta R(pc1, pc2) \quad (6)$$
$$= s0 - s1*pc1 - s2*pc2 + s3*pc1^2 +$$
$$s4*pc1*pc2 + s5*pc2^2$$

$$\Delta C = \Delta C(pc1, pc2)$$
$$= s6 + s7*pc1 + s8*pc2 + s9*pc1^2 +$$
$$s10*pc1*pc2 + s11*pc2^2$$

where s0, . . . , s11 are coefficients derived by substituting values for the two independent parameters pc1 and pc2 and the corresponding values of $\Delta R$ and $\Delta C$ from simulation results, and solving for the coefficients s0, . . . , s11. Table 2 below illustrates exemplary values for s0, . . . , s11 for a weighted combination of isolated and dense lines and for isolated lines alone.

TABLE 2

| COEFF | ISOLATED & DENSE LINES | ISOLATED LINES |
|---|---|---|
| s0 | 1.245 | 1.245 |
| s1 | 4.055 | 4.055 |
| s2 | 3.121 | 3.121 |
| s3 | 0.1308 | 0.1308 |
| s4 | 0.1621 | 0.1621 |
| s5 | 0.1591 | 0.1591 |
| s6 | 0.319 | 0.190 |
| s7 | 1.801 | 1.231 |
| s8 | 0.1449 | 1.630 |
| s9 | .0121 | .0370 |
| s10 | .0216 | 0 |
| s11 | .0125 | 0 |

The number of parameters is reduced by applying Principal Component Analysis (PCA) to the previously described Monte Carlo data, resulting in the two independent parameters pc1 and pc2. Regression may be performed on pc1 and pc2 and combined with their calculated variances to generate new second order polynomial equations for $\Delta R$ and $\Delta C$, hence Delay=Delay(pc1,pc2).

In a delay calculation method of the present invention, the delays are first calculated net by net. For each net, a search is performed in a range of variation of pc1 and pc2 to find a maximum/minimum estimated delay for the sum of the delay of the cell driving the net and the net delay. Reducing the number of physical parameters to the two independent variables pc1 and pc2 advantageously increases the efficiency of the search. When the value of pc1 and pc2 that results in the maximum/minimum delay value is found, equations (6) are used to modify all the values of R and C of the net. Using the modified values of R and C of the net, a full AWE based delay calculation is performed, and the delay is written into a SDF (standard delay format) file.

The three variables tmet, w and timd each have a corresponding normal distribution, mean value, and variation sigma. Assuming that the probability of all three variables reaching their 3-sigma points is less than 99.7 percent, the probability of a single normal distribution variable at its 3-sigma point, the variation search space of the Principal Component Analysis and the real physical parameters may be constrained to the following constant probability ellipsoids for two variables:

$$\left(\frac{pc1}{Rpc1}\right)^2 + \left(\frac{pc2}{Rpc2}\right)^2 = 9 \qquad (7)$$

and $$\left(\frac{\Delta tmet}{\Delta Rtmet}\right)^2 + \left(\frac{\Delta w}{\Delta Rw}\right)^2 + \left(\frac{\Delta tmid}{\Delta Rtmid}\right)^2 = 9 \qquad (8)$$

Rpc1 and Rpc2 are the radii of the constant probability ellipsoids derived from data simulation. Representative values of Rpc1 and Rpc2 are 2.48 and 1.28, respectively. Equation (7) allows the independent parameters pc1 and pc2 to reach their 3-sigma values at different points in the search space. The radius of the constant probability ellipsoids may be calculated based on the number of variables, the corresponding sigma for each variable, and the Chi-square distribution from the Monte Carlo simulation.

A path delay is the summation of each individual stage delay, that is, the cell delay plus net delay. The square of the path delay variation should be the summation of each individual stage delay variation if they are mutually independent. Each stage delay has roughly a normal distribution when the metal variation is taken into account, and the metal variation for different nets should be independent, that is, their distributions are not correlated. Each stage delay distribution is therefore independent from that of another. If the 3-sigma delay value for each stage is summed in the total path delay, the total path delay variation would be well beyond its 3-sigma value. The variation is therefore preferably calculated as follows:

$$\text{sigma}^2 = \text{sigma1}^2 + \text{sigma2}^2 + \ldots + \text{sigmaN}^2 \qquad (9)$$

where sigma is the path delay distribution variation and sigmaN is the Nth stage delay distribution variation.

The sigma for each path delay may be obtained, for example, from available timing analysis tools such as Primetime. By way of example, a nominal delay calculation is performed and a set of path delays with each stage delay is reported. A maximum delay within the variation is calculated in accordance with the method of the present invention, the result is written to the SDF file, and another set of path delays with each stage delay is reported by the timing analysis tool based on the SDF delay. Each stage delay for the same path is compared and subtracted to obtain the sigma value for each stage delay. The squares of the sigma values are summed, and the total path variation is calculated as the square root of the sum of the squares.

Path delay information is generally not available when delays are calculated. Moreover, equation (9) may not be practical for an actual design, therefore the search space may be further constrained for each individual net (stage) variation to a point that is within less than 3 sigma so that the reported path delay that matches the path delay variation may be calculated from equation (9). Experimentation has shown that constraining individual net variation to its 1.25-sigma point results in a close match of the path delays using the following equation:

$$\left(\frac{3*pc1}{1.25*Rpc1}\right)^2 + \left(\frac{3*pc2}{1.25*Rpc2}\right)^2 = 9 \qquad (10)$$

Equation (10) has been shown by experiment to result in a path delay with an error margin of 0–40 picoseconds. The error is intentionally made positive to be conservative.

The clock path is separated from the data path as follows. For a set up timing check, a fast clock and slow data are desirable. The clock path usually has less logic than the data path, and the variations in the clock path delay have an insignificant impact on the timing check, assuming that the variations of the clock net and the data net are not correlated. Accordingly, the clock path is separated from the data path by leaving the clock net unchanged and varying only the data path delay. For a hold timing check, the clock path delay is almost the same as the data path delay, but because the clock path delay has a small value, a margin value is calculated and added to the flip-flop's hold time to simplify the calculation.

Equations (1) may be verified by comparing the path delay of a corner SPEF and the modified nominal SPEF. A corner SPEF file is extracted with a corner tech file, then a delay calculation is performed to obtain path delays for a set of critical paths. An SPEF is extracted at a nominal condition, and the capacitance and resistance values of the nominal SPEF files are modified according to equations (1). The delay calculation is repeated with the modified values of the capacitance and resistance to obtain the new data path delay. The two sets of path delay data for the same data path have been compared to verify the accuracy of equations (1) at 0.5 percent of the total path delay.

Although the method of the present invention requires some additional delay estimation, there is no time penalty for SPEF file extraction. Advantageously, the maximum delay at worst case may be found by the method of the present invention for a wide range of nets and cells. The clock net and signal nets are advantageously separated in the delay calculation and separately considered in the delay calculation. Multiple variables may be reduced to two, advantageously simplifying the calculations. The clock path is separated from the data path by leaving the clock net unchanged and varying only the data net delay, improving the robustness of the timing checks for the integrated circuit design.

In alternative embodiments, the path delay variation may be calculated by changing each cell/net delay for any type of variation of the net, for example, crosstalk. The path delay constraints should also be taken into account, because each stage delay is independent. Multi-variable constraints should be taken into account if there are multiple variation variables for each net. If path information is available, the sigma square summation may be used to obtain the path delay variation; otherwise, the sigma of each net may be reduced to obtain a 3-sigma variation of the path delay.

In other embodiments, separate equations (1) may be used for each net. Each equation may be net related, that is, different nets may have different equation coefficients.

FIGS. 1A, 1B and 1C illustrate a flow chart 100 of a method of calculating delay for a process variation according to an embodiment of the present invention.

Step 102 is the entry point of the flow chart 400.

In step 104, a variation of resistance and a variation of capacitance are modeled as functions of a number of physical parameters of a selected process for manufacturing an integrated circuit for each selected net in an integrated circuit design according to equations (1).

In step 106, two independent variables pc1 and pc2 are derived from the physical parameters tmet, w and timd. Each of the two independent variables pc1 and pc2 is a linear combination of the physical parameters tmet, w and timd, and may be found, for example, by Principal Component Analysis. Steps 104 and 106 are performed once for each process. The following steps are performed once for each net.

In step 108, a new value for each of the two independent variables pc1 and pc2 is selected that is within the variation expressed in equation (10).

In step 110, the variation of resistance is calculated from the value found for each of the two independent variables by substituting the values selected for pc1 and pc2 in equations (6).

In step 112, the variation of capacitance is calculated from the value found for each of the two independent variables by substituting the values selected for pc1 and pc2 in equations (6).

In step 114, the calculated variation of resistance is added to the net resistance to generate an estimated net resistance for each net.

In step 116, the calculated variation of capacitance is added to the net capacitance to generate an estimated net capacitance for each net.

In step 118, the estimated net delay for a step input from the net driver's output pin is obtained from a first order AWE, or Elmore delay.

In step 120, the estimated cell delay is found by substituting the estimated net capacitance for the cell load and finding the corresponding cell delay in a lookup table of delay vs. load capacitance values for a ramptime of zero.

In step 122, the estimated net delay is added to the estimated cell delay to generate the estimated cell delay plus net delay.

In step 124, if the estimated cell delay plus net delay reaches a maximum or a minimum, control is transferred to step 126. Otherwise, control is transferred to step 108.

In step 126, the variation of resistance and the variation of capacitance is calculated from equations (6).

In step 128, modified values of resistance and capacitance are calculated from the variation of resistance and the variation of capacitance.

In step 130, a full AWE calculation of the cell delay plus the net delay is performed.

In step 132, the cell delay plus the net delay is generated as output to a SDF file.

In step 134, the variation of resistance and the variation of capacitance are used to calculate the cell delay plus the net delay for each selected net that is a data path net for a setup timing check. The clock path nets are left unchanged.

In step 136, a margin is added to the hold time for each selected net for a hold timing check.

In step 138, a setup and hold time check is performed on each selected net in the integrated design using, for example, Primetime.

Step 140 is the exit point of the flow chart 100.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The method illustrated in the flowchart above may be embodied in a computer program product for calculating delay for a process variation according to various embodiments of the present invention and implemented by a computer according to well known programming techniques to perform the following functions: finding a value for each of two independent variables that results in a maximum or minimum variation of estimated cell delay plus net delay, calculating a variation of resistance from the value found for each of the two independent variables, calculating a variation of capacitance from the value found for each of the two independent variables, adding the calculated variation of resistance to a net resistance to generate a modified net resistance of each of the plurality of nets, adding the calculated variation of capacitance to a net capacitance to generate a modified net capacitance of each of the plurality of nets, and calculating the cell delay plus net delay from the modified net resistance and the modified net capacitance.

In further embodiments, finding a value for each of the two independent variables that results in a maximum or minimum variation of estimated cell delay plus net delay includes constraining a search of the variation of capacitance to a constant probability ellipsoid. The constant probability ellipsoid may be given by, for example, equation (10).

In a further embodiment, the number of physical parameters is reduced by principal component analysis to two independent variables. Each of the two independent variables is a linear combination of the number of physical parameters. The two independent variables may be derived from the number of physical parameters by principal component analysis.

In a further embodiment, the clock path and the data path are separated by adding the calculated variation of resistance and capacitance only to data path nets to perform a set up timing check. To perform a hold timing check, a margin is added to the hold time.

While the invention herein disclosed has been described by means of specific embodiments and applications thereof, numerous modifications and variations could be made thereto by those skilled in the art without departing from the scope of the invention set forth in the following claims.

What is claimed is:

1. A method of calculating cell delay plus net delay for a process variation comprising:

finding a value for each of exactly two independent variables that results in a maximum or minimum variation of estimated cell delay plus net delay;

calculating a variation of resistance from the value found for each of the exactly two independent variables;

calculating a variation of capacitance from the value found for or each of the exactly two independent variables;

adding the calculated variation of resistance to a net resistance to generate a modified net resistance of each of a plurality of nets;

adding the calculated variation of capacitance to a net capacitance to generate a modified net capacitance of each of the plurality of nets; and calculating the cell delay plus net delay from the modified net resistance and the modified net capacitance wherein each of the exactly two independent variables is a linear combination of a number of physical parameters of a selected process for manufacturing an integrated circuit.

2. The method of claim 1 wherein finding a value for each of the exactly two independent variables that results in a maximum or minimum variation of estimated cell delay plus net delay includes constraining a search of the variation of capacitance to a constant probability ellipsoid.

3. The method of claim 1 wherein the exactly two independent variables are derived by principal component analysis from a plurality of physical parameters for a selected process for manufacturing an integrated circuit.

4. The method of claim 1 wherein a margin is added to a hold time of each of the plurality of nets to perform a hold timing check.

5. A method of calculating cell delay plus net delay for a process variation comprising:

finding a value for each of exactly two independent variables that results in a maximum or minimum variation of estimated cell delay plus net delay;

calculating a variation of resistance from the value found for each of the exactly two independent variables;

calculating a variation of capacitance from the value found for each of the exactly two independent variables;

adding the calculated variation of resistance to a net resistance to generate a modified net resistance of each of a plurality of nets;

adding the calculated variation of capacitance to a net capacitance to generate a modified net capacitance of each of the plurality of nets; and calculating the cell delay plus net delay from the modified net resistance and the modified net capacitance wherein finding a value for each of the exactly two independent variables includes constraining a search of the variation of capacitance to a constant probability ellipsoid wherein the constant probability ellipsoid is constrained to a 3-sigma point approximately given by:

$$\left(\frac{pc1}{Rpc1}\right)^2 + \left(\frac{pc2}{Rpc2}\right)^2 = 9$$

wherein pc1 and pc2 are representative of the exactly two independent variables, respectively, and Rpc1 and Rpc2 are radii of the constant probability ellipsoid.

6. A method of calculating cell delay plus net delay for a process variation comprising:

finding a value for each of exactly two independent variables that results in a maximum or minimum variation of estimated cell delay plus net delay;

calculating a variation of resistance from the value found for each of the exactly two independent variables;

calculating a variation of capacitance from the value found for each of the exactly two independent variables;

adding the calculated variation of resistance to a net resistance to generate a modified net resistance of each of a plurality of nets;

adding the calculated variation of capacitance to a net capacitance to generate a modified net capacitance of each of the plurality of nets; and calculating the cell delay plus net delay from the modified net resistance and the modified net capacitance wherein finding a value for each of the exactly two independent variables includes constraining a search of the variation of capacitance to a constant probability ellipsoid wherein the constant probability ellipsoid is constrained to a 1.25-sigma point approximately given by:

$$\left(\frac{3*pc1}{1.25*Rpc1}\right)^2 + \left(\frac{3*pc2}{1.25*Rpc2}\right)^2 = 9$$

wherein pc1 and pc2 are representative of the exactly two independent variables, respectively, and Rpc2 and Rpc2 are radii of the constant probability ellipsoid.

7. A method of calculating cell delay plus net delay for a process variation comprising:

finding a value for each of exactly two independent variables that results in a maximum or minimum variation of estimated cell delay plus net delay;

calculating a variation of resistance from the value found for each of the exactly two independent variables;

calculating a variation of capacitance from the value found for each of the exactly two independent variables;

adding the calculated variation of resistance to a net resistance to generate a modified net resistance of each of a plurality of nets;

adding the calculated variation of capacitance to a net capacitance to generate a modified net capacitance of each of the plurality of nets; and calculating the cell delay plus net delay from the modified net resistance and the modified net capacitance, and wherein finding a value for each of the exactly two independent variables that results in a maximum or minimum variation of estimated cell delay plus net delay includes constraining a search of the variation of capacitance to a constant probability ellipsoid wherein the constant probability ellipsoid has radii substantially equal to 2.48 and 1.28.

8. A method of calculating cell delay plus net delay for a process variation comprising:

finding a value for each of exactly two independent variables that results in a maximum or minimum variation of estimated cell delay plus net delay;

calculating a variation of resistance from the value found for each of the exactly two independent variables;

calculating a variation of capacitance from the value found for each of the exactly two independent variables;

adding the calculated variation of resistance to a net resistance to generate a modified net resistance of each of a plurality of nets;

adding the calculated variation of capacitance to a net capacitance to generate a modified net capacitance of each of the plurality of nets; and calculating the cell delay plus net delay from the modified net resistance and the modified net capacitance wherein the plurality of nets excludes nets that are clock path nets to perform a set up timing check.

9. A computer program product for calculating cell delay plus net delay for a process variation comprising;

a medium for embodying a computer program for input to a computer; and a computer program embodied in the medium for causing the computer to perform the following functions:

finding a value for each of exactly two independent variables that results in a maximum or minimum variation of estimated cell delay plus net delay;

calculating a variation of resistance from the value found for each of the exactly two independent variables;

calculating a variation of capacitance from the value found for each of the exactly two independent variables;

adding the calculated variation of resistance to a net resistance to generate a modified net resistance of each of a plurality of nets;

adding the calculated variation of capacitance to a net capacitance to generate a modified net capacitance of each of the plurality of nets; and calculating the cell delay plus net delay from the modified net resistance and the modified net capacitance wherein each of the exactly two independent variables is a linear combination of a number of physical parameters of a selected process for manufacturing an integrated circuit.

10. The computer program product of claim 9 wherein finding a value for each of the exactly two independent variables that results in a maximum or minimum variation of estimated cell delay plus net delay includes constraining a search of the variation of capacitance to a constant probability ellipsoid.

11. The computer program product of claim 9 wherein the exactly two independent variables are derived by principal component analysis from a plurality of physical parameters for a selected process for manufacturing an integrated circuit.

12. The computer program product of claim 9 wherein the plurality of nets excludes nets that are clock path nets to perform a set up timing check.

13. The computer program product of claim 9 wherein a margin is added to a hold time of each of the plurality of nets to perform a hold timing check.

14. A computer program product for calculating cell delay plus net delay for a process variation comprising:
- a medium for embodying a computer program for input to a computer; and
- a computer program embodied in the medium for causing the computer to perform the following functions:
    - finding a value f or each of exactly two independent variable that results in a maximum or minimum variation of estimated cell delay plus net delay;
    - calculating a variation of resistance from the value found for each of the exactly two independent variables;
    - calculating a variation of capacitance from the value found for each of the exactly two independent variables;
    - adding the calculated variation of resistance to a net resistance to generate a modified net resistance of each of a plurality of nets;
    - adding the calculated variation of capacitance to a net capacitance to generate a modified net capacitance of each of the plurality of nets; and
    - calculating the cell delay plus net delay from the modified net resistance and the modified net capacitance
    - wherein finding a value for each of the exactly two independent variables that results in a maximum or minimum variation of estimated cell delay plus net delay includes constraining a search of the variation of capacitance to a constant probability ellipsoid wherein the constant probability ellipsoid is constrained to a 3-sigma point approximately given by:

$$\left(\frac{pc1}{Rpc1}\right)^2 + \left(\frac{pc2}{Rpc2}\right)^2 = 9$$

wherein pc1 and pc2 are representative of the exactly two independent variables, respectively, and Rpc2 and Rpc2 are radii of the constant probability ellipsoid.

15. A computer program product for calculating cell delay plus net delay for a process variation comprising:
- a medium for embodying a computer program for input to a computer; and
- a computer program embodied in the medium for causing the computer to perform the following functions:
    - finding a value for each of exactly two independent variables that results in a maximum or minimum variation of estimated cell delay plus net delay;
    - calculating a variation of resistance from the value found for each of the exactly two independent variables;
    - calculating a variation of capacitance from the value found for each of the exactly two independent variables;
    - adding the calculated variation of resistance to a net resistance to generate a modified net resistance of each of a plurality of nets;
    - adding the calculated variation of capacitance to a net capacitance to generate a modified net capacitance of each of the plurality of nets; and
    - calculating the cell delay plus net delay from the modified net resistance and the modified net capacitance
    - wherein finding a value for each of the exactly two independent variables that results in a maximum or minimum variation of estimated cell delay plus net delay includes constraining a search of the variation of capacitance to a constant probability ellipsoid wherein the constant probability ellipsoid is constrained to a 1.25-sigma point approximately given by:

$$\left(\frac{3*pc1}{1.25*Rpc1}\right)^2 + \left(\frac{3*pc2}{1.25*Rpc2}\right)^2 = 9$$

wherein pc1 and pc2 are representative of the exactly two independent variable, respectively, and Rpc1 and Rpc2 are radii of the constant probability ellipsoid.

16. The computer program product claim 15 wherein the constant probability ellipsoid has radii substantially equal to 2.48 and 1.28.

17. A method of calculating cell delay plus net delay for a process variation comprising:
    (a) selecting new values for each of exactly two independent variables derived as a linear combination of a plurality of physical parameters of a function of variation of resistance and of a function of variation of capacitance for a selected process for manufacturing an integrated circuit wherein each selected value is within a variation allowed by a constant probability ellipsoid;
    (b) calculating a variation of resistance from the new values;
    (c) calculating a variation of capacitance from the new values;
    (d) adding the calculated variation, of resistance to a net resistance to generate an estimated net resistance for each of a plurality of nets of the integrated circuit;
    (e) adding the calculated variation of capacitance to a net capacitance to generate an estimated net capacitance for each of the plurality of nets of the integrated circuit;
    (f) estimating a net delay for a step input from the estimated net resistance and the estimated net capacitance for each of the plurality of nets;
    (g) estimating a cell delay for a ramptime of zero for each of the plurality of nets;
    (h) adding the estimated net delay to the estimated cell delay to generate the estimated cell delay plus net delay; and
    (i) if the estimated cell delay plus net delay has not reached a maximum or a minimum, then repeating (a) through (h) until the estimated cell delay plus net delay has reached a maximum or a minimum.

18. The method of claim 17 further comprising (j) calculating modified values of resistance and capacitance from the variation of resistance and the variation of capacitance after the estimated cell delay plus net delay has reached a maximum or a minimum.

19. The method of claim 18 further comprising (k) performing a full AWE calculation of the cell delay plus the net delay from the modified values of resistance and capacitance.

20. The method of claim 19 further comprising (l) generating the cell delay plus the net delay as output to a SDF file.

21. The method of claim 20 further comprising (m) calculating the cell delay plus the net delay only for each of the plurality of nets that is a data path net for performing a setup timing check.

22. The method of claim 21 further comprising (n) adding a margin to the hold time for each of the plurality of nets for performing a hold timing check.

23. The method of claim 22 further comprising (o) performing the setup timing check and the hold timing check on each of the plurality of nets.

* * * * *